United States Patent [19]

Narusawa et al.

[11] Patent Number: 4,646,303
[45] Date of Patent: Feb. 24, 1987

[54] DATA ERROR DETECTION AND CORRECTION CIRCUIT

[75] Inventors: Sadayuki Narusawa; Norio Tomisawa, both of Hamamatsu, Japan

[73] Assignee: Nippon Gakki Seizo Kabushiki Kaisha, Hamamatsu, Japan

[21] Appl. No.: 643,951

[22] Filed: Aug. 24, 1984

[30] Foreign Application Priority Data

Oct. 5, 1983 [JP] Japan ............................. 58-186105
Nov. 25, 1983 [JP] Japan ............................. 58-221789

[51] Int. Cl.⁴ ......................................... G06F 11/08
[52] U.S. Cl. ..................................... 371/38; 371/37
[58] Field of Search ................ 371/38, 37; 360/38.1, 360/53

[56] References Cited

U.S. PATENT DOCUMENTS

| | | | |
|---|---|---|---|
| 4,142,174 | 2/1979 | Chen | 371/37 |
| 4,413,339 | 10/1983 | Riggle | 371/38 |
| 4,564,945 | 1/1986 | Glover | 360/38.1 |

Primary Examiner—Jerry Smith
Assistant Examiner—Robert W. Beausoliel, Jr.
Attorney, Agent, or Firm—Spensley Horn Jubas & Lubitz

[57] ABSTRACT

In a digital system, there is provided a circuit for detecting and correcting errors in a group of data using Reed-Solomon codes. The group of data is first stored in a memory, and syndromes of the data are produced by a syndrome calculation circuit and fed to an internal data bus. A first data conversion circuit converts the syndromes on the internal data bus into logarithmic values and a multiplier-divider circuit executes multiplication or division of the data on the internal data bus by addition and subtraction operations of the logarithmic values. A second data conversion circuit converts antilogarithmically data from the multiplier-divider circuit, and an addition and subtraction circuit executes addition or subtraction of the data from the second data conversion circuit. An error detection circuit detects whether a single error exists in the group of data in accordance with the syndromes, and an error detection signal representing existence of error and an error location signal representing error location are produced. An address control circuit addresses the memory in accordance with the error detection signal and the error location signal so that the memory outputs an error data. A data correction circuit adds one of the syndromes representing amount of data error on the internal data bus to the error data outputted from the memory to produce its correct data. A double data error can be detected and corrected using Reed-Solomon codes in a similar manner.

5 Claims, 9 Drawing Figures

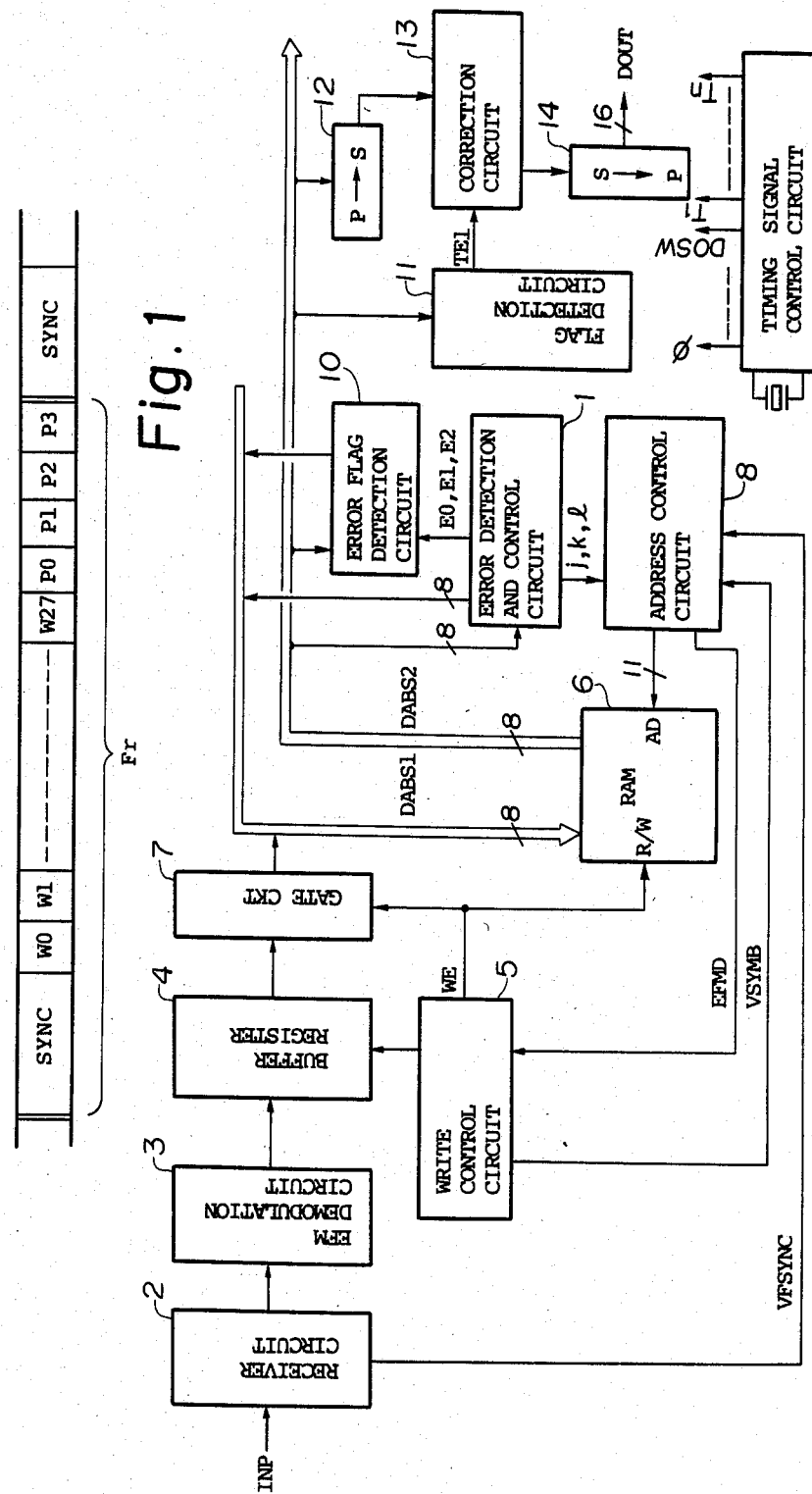

|        | 9 | 10 | 11    | 12    | 13    | 14    | 15    | 16    |
|--------|---|----|-------|-------|-------|-------|-------|-------|
| Ra(1)  |   | S2 | S1    | S0    | S3    | S4    | S5    |       |
| Ra(2)  |   |    | S2    | S1    | S0    | S3    | S4    | S5    |
| AND(2) |   |    | S1 S2 | S0 S1 | S0 S3 | S0 S4 | S4 S5 |       |
| Ra(7)  |   |    |       | S1 S2 | S0 S1 |       |       |       |
| Ra(8)  |   |    |       |       | S1 S2 |       |       |       |
| OR(1)  |   |    | S1+S2 | S0+S1 | S3+S0 | S4+S3 | S5+S4 |       |
| Ra(3)  |   |    |       | S1+S2 | S0+S1 | S3+S0 |       |       |
| Ra(4)  |   |    |       |       | S1+S2 | S0+S1 | S3+S0 |       |
| Ra(5)  |   |    |       |       |       | S1+S2 | S0+S1 |       |
| Ra(6)  |   |    |       |       |       |       | S1+S2 | S0+S1 |

Fig. 8

DATA ERROR DETECTION AND CORRECTION CIRCUIT

BACKGROUND OF THE INVENTION

1. Field of the Invention

This invention relates to a data error detection and correction circuit for use in digital systems such as digital audio disc (DAD) players.

2. Prior Art

In DAD systems, data errors are attributable to a damaged disc of which damage may either be present in the disc from the beginning or develop during the handling thereof, a disturbance in an associated reproduction system and so on. Such data errors must be corrected so that the DAD player can reproduce musical signals properly. Therefore, it is essential for DAD players to be equipped with a circuitry for detecting and correcting such data errors.

It is known in the art to detect such data errors by means of Reed Solomon code. The Reed Solomon code method will now be described. Both musical signal data and error correction parity data are stored in a disc. FIG. 1 schematically shows a portion of data stored in the disc, the data comprising a number of frames Fr each comprising signal data W0 to W27, error correction parity data P0 to P3, and a synchronization pattern SYNC. Each of the signal data W0 to W27 as well as each of the parity data P0 to P3 is composed of eight bits. The frame Fr is a data unit for data error correction. Control data and additional error correction parity data other than the parity data P0 to P3 are also stored in the frame Fr, but they are omitted for simplicity of explanation of this invention. All of the above data are modulated in an EFM (Eight to Fourteen Modulation) fashion and stored in the disc. The parity data P0 to P3 are determined to establish the following formula (1):

$$\begin{bmatrix} 1 & 1 & - & 1 & 1 & 1 \\ \alpha^{31} & \alpha^{30} & - & \alpha^2 & \alpha^1 & 1 \\ \alpha^{62} & \alpha^{60} & - & \alpha^4 & \alpha^2 & 1 \\ \alpha^{93} & \alpha^{90} & - & \alpha^6 & \alpha^3 & 1 \end{bmatrix} \begin{bmatrix} W0 \\ W1 \\ \vdots \\ W27 \\ P0 \\ P1 \\ P2 \\ P3 \end{bmatrix} = \begin{bmatrix} 0 \\ 0 \\ 0 \\ 0 \end{bmatrix} \quad (1)$$

wherein $\alpha$ is a primitive element with respect to a formula "$F(X) = X^8 + X^3 + X^2 + 1$".

For reproducing the musical signals, the signal data W0 to W27 and parity data P0 to P3 shown in FIG. 1 are read out from the disc, and syndromes S0 to S3 are calculated in accordance with the data W0 to W27 and P0 to P3, through associated digital computing means in the following manner:

$$\begin{bmatrix} S0 \\ S1 \\ S2 \\ S3 \end{bmatrix} = \begin{bmatrix} 1 & 1 & - & 1 & 1 & 1 \\ \alpha^{32} & \alpha^{30} & - & \alpha^2 & \alpha^1 & 1 \\ \alpha^{62} & \alpha^{60} & - & \alpha^4 & \alpha^2 & 1 \\ \alpha^{93} & \alpha^{90} & - & \alpha^6 & \alpha^3 & 1 \end{bmatrix} \begin{bmatrix} W0 \\ W1 \\ \vdots \\ P3 \end{bmatrix} \quad (2)$$

Then, in accordance with respective values of syndromes S0 to S3 it is determined whether there is any error in the data W0 to W27 and P0 to P3, and if any errors are determined to exist, their positions are detected and they are corrected in a manner described hereinafter.

In this Reed Solomon code method, the parity data P0 to P3 are not distinguished from the musical signal data W0 to W27. More specifically, the parity data P0 to P3 can be considered as imaginary signal data W28 to W31 following the signal data W0 to W27. Therefore, with this method, any error in the parity data P0 to P3 can also be detected. Thus, errors in the parity data P0 to P3 can be recognized as errors in the signal data W28 to W31, respectively. For example, if it is detected that there is an error in the thirtieth data, that is, the data W 29, this means that this error exists in the parity data P1.

①. Determination of data error

It is determined whether the following formula (3) is established:

$$\begin{bmatrix} S0 \\ S1 \\ S2 \\ S3 \end{bmatrix} = \begin{bmatrix} 0 \\ 0 \\ 0 \\ 0 \end{bmatrix} \quad (3)$$

If the formula (3) is established, then there is no error in any of the data W0 to W27 and P0 to P3. On the other hand, if the formula is not established, then there is an error in one or more of the data W0 to W27 and P0 to P3.

②. Detection of single data error

Assuming that there is an error only in No. j of the data W0 and W27 and W28 to W31 (P0 to P3), i.e., the data Wj, the following formula (4) is established:

$$\begin{bmatrix} S0 \\ S1 \\ S2 \\ S3 \end{bmatrix} = \begin{bmatrix} Ej \\ \alpha^j \cdot Ej \\ \alpha^{2j} \cdot Ej \\ \alpha^{3j} \cdot Ej \end{bmatrix} \quad (4)$$

wherein Ej is data error or error pattern, i.e., a difference between correct data Wj (hereinafter referred to as $<Wj>$) and the data Wj read out from the disc. The following formulas (5) and (6) are obtained from the formula (4):

$$S1^2 = S0 \cdot S2 \quad (5)$$

$$S2^2 = S1 \cdot S3 \quad (6)$$

If there is an error in the data Wj, the following formulas (7) to (10) are also established:

$$S0 \neq 0 \quad (7)$$

$$S1 \neq 0 \quad (8)$$

$$S2 \neq 0 \quad (9)$$

$$S3 \neq 0 \quad (10)$$

Thereafter, it is determined whether all of the formulas (5) to (10) are established, and if these formulas are established, it is decided that there is an error only in the data Wj. In this case, the data error Ej is syndrome S0.

③. Correction of single data error

The following formula (11) is obtained from the formula (4):

$$S1/S0 = \alpha^j \quad (11)$$

The left member of the formula (11) is calculated, and in accordance with the result of this calculation, the position j of the incorrect data is detected. Then, the data error Ej, which is equal to S0 (Ej=S0), is added to the data Wj read out from the disc to obtain the coreect data <Wj> as indicated in the following formula (12):

$$Wj + Ej = <Wj> \quad (12)$$

④. Detection of double data error

Assuming that there is an error in each of data Wk and Wl, the formula (13) is established:

$$\begin{bmatrix} S0 \\ S1 \\ S2 \\ S3 \end{bmatrix} = \begin{bmatrix} Ek & + El \\ \alpha^k \cdot Ek & + \alpha^l \cdot El \\ \alpha^{2k} \cdot Ek & + \alpha^{2l} \cdot El \\ \alpha^{3k} \cdot Ek & + \alpha^{3l} \cdot El \end{bmatrix} \quad (13)$$

wherein Ek and El are data errors of the data Wk and Wl, respectively.

The following formulas (14) and (15) are obtained from the formula (13):

$$\alpha^k + \alpha^l = \frac{S1 \cdot S2 + S0 \cdot S3}{S1^2 + S0 \cdot S2} \quad (14)$$

$$\alpha^k \cdot \alpha^l = \frac{S2^2 + S1 \cdot S3}{S1^2 + S0 \cdot S2} \quad (15)$$

Also, in this case, the following formulas (16) and (17) are established:

$$0 \leq k, l \leq 31 \quad (16)$$

$$k \neq l \quad (17)$$

In this case, if each of k and l is one of 28 to 31, each error exists in any of the parity data P0 to P3.

Therefore, the right member of each of the formulas (14) and (15) is calculated from syndromes S0 to S3, and then k and l are obtained from the formulas (14) to (17). If k and l can be obtained, it is decided that there is an error in each of the data Wk and Wl. On the other hand, if k and l can not be obtained although there is more than one error, then there are at least three errors in the data W0 to W27 and P0 to P3. Incidentally, it is not possible to detect the positions of more than two incorrect data by means of syndromes S0 to S3.

⑤. Correction of double data error

In the case where there is an error in each of the data Wk and Wl, each of the data errors Ek and El is calculated from the following formula (18):

$$\begin{bmatrix} Ek \\ El \end{bmatrix} = \frac{1}{\alpha^k + \alpha^l} \begin{bmatrix} S1 + \alpha^l \cdot S0 \\ S1 + \alpha^k \cdot S0 \end{bmatrix} \quad (18)$$

The data errors Ek and El are added respectively to the data Wk and Wl detected at the above step in item ④, to obtain the correct data <Wk> and <Wl>, as indicated in the following:

$$Wk + Ek = <Wk> \quad (19)$$

$$Wl + El = <Wl> \quad (20)$$

Thus, the data error detection and correction is carried out with the Reed Solomon code method in the above-mentioned manner.

SUMMARY OF THE INVENTION

It is an object of this invention to provide a data error detection and correction circuit whereby the data error detection and correction can be carried out quickly with a simplified hardware.

According to an embodiment of the present invention, there is provided a data error detection and correction circuit for detecting and correcting single data error in a group of data using Reed-Solomon codes comprising a memory for storing the group of data; a syndrome calculation circuit for producing syndromes Si (i is a positive integer) from the group of data; an internal data bus; a first data conversion circuit for converting data on the internal data bus into logarithmic data; a multiplier-divider circuit for operating on the data on said internal data bus by addition operation of the logarithmic data; a second data conversion means for antilogarithmically converting data from the multiplier-divider circuit; an addition and subtraction circuit for operating on the data from the second data conversion circuit and supplying resulted operated data to the internal data bus; a first error detection circuit for detecting whether a single error exists in the group of data in accordance with the syndromes and the resulted operated data on the internal data bus to generate a first error detection signal by means of determinations whether $S1^2 = S0 \cdot S2$, $S2^2 = S1 \cdot S3$, $S1 \neq 0$, $S2 \neq 0$, $S3 \neq 0$ and $S4 \neq 0$; a first error location detection circuit for detecting a location where the single error exists at the time the first error detection circuit detects the single error and producing a first error location signal; an address control circuit for addressing the memory in accordance with the first error detection signal and output data of the multiplier-divider circuit to read an error data therefrom; and a data correction circuit responsive to the timing signals from the timing signal generating circuit for adding one of the syndromes on the internal data bus to the error data outputted from the memory to thereby produce its correct data.

According to another embodiment of this invention for double error detection and correction, there is provided a data error detection and correction circuit for detecting and correcting double errors in a group of data using Reed-Solomon codes comprising memory means for storing the group of data; a syndrome calculation circuit for producing syndromes Si (i is a positive integer) from the group of data; an internal data bus; first data conversion means for converting data on the internal data bus into logarithmic data; multiplier-divider means for making operation of the data on the internal data bus by addition and subtraction operations of the logarithmic data; second data conversion means for antilogarithmically converting data from the multiplier-divider means; addition and subtraction means for making operation of the data from the second data conversion means and supplying resulted operated data to the internal data bus; a second error detection circuit for detecting whether double errors exist in the group of data in accordance with the output data of the multiplier-divider means and the second data conversion means by means of determinations whether $$(S1\cdot S2+S0\cdot S3)/(S1\cdot S1+S0\cdot S2)=\alpha^k+\alpha^l,$$

$$(S2\cdot S2+S1\cdot S3)/(S1\cdot S1+S0\cdot S2)=\alpha^k\cdot\alpha^l,$$

wherein k and l are zero or positive integers, the second error detection circuit generating a second error detection signal and a second error location signal when double errors are detected; address control means for addressing the memory means in accordance with the second error detection signal and the second error location signal to read error data therefrom; and a data correction circuit for adding data fed from the internal data bus representing data errors to the error data read from the memory means, respectively, to thereby produce corrected data against the error data.

BRIEF DESCRIPTION OF THE DRAWINGS

FIG. 1 is a diagrammatical illustration showing a portion of the data stored in a disc for a digital audio disc player;

FIG. 2 is a block diagram of a main portion of the digital audio disc player incorporating a data error detection and correction circuit provided in accordance with the present invention;

FIG. 8 is a timing chart of the operation of the data detection and correction circuit; showing that there is no data error nor a single error.

DESCRIPTION OF THE PREFERRED EMBODIMENT OF THE INVENTION

Figure 3:
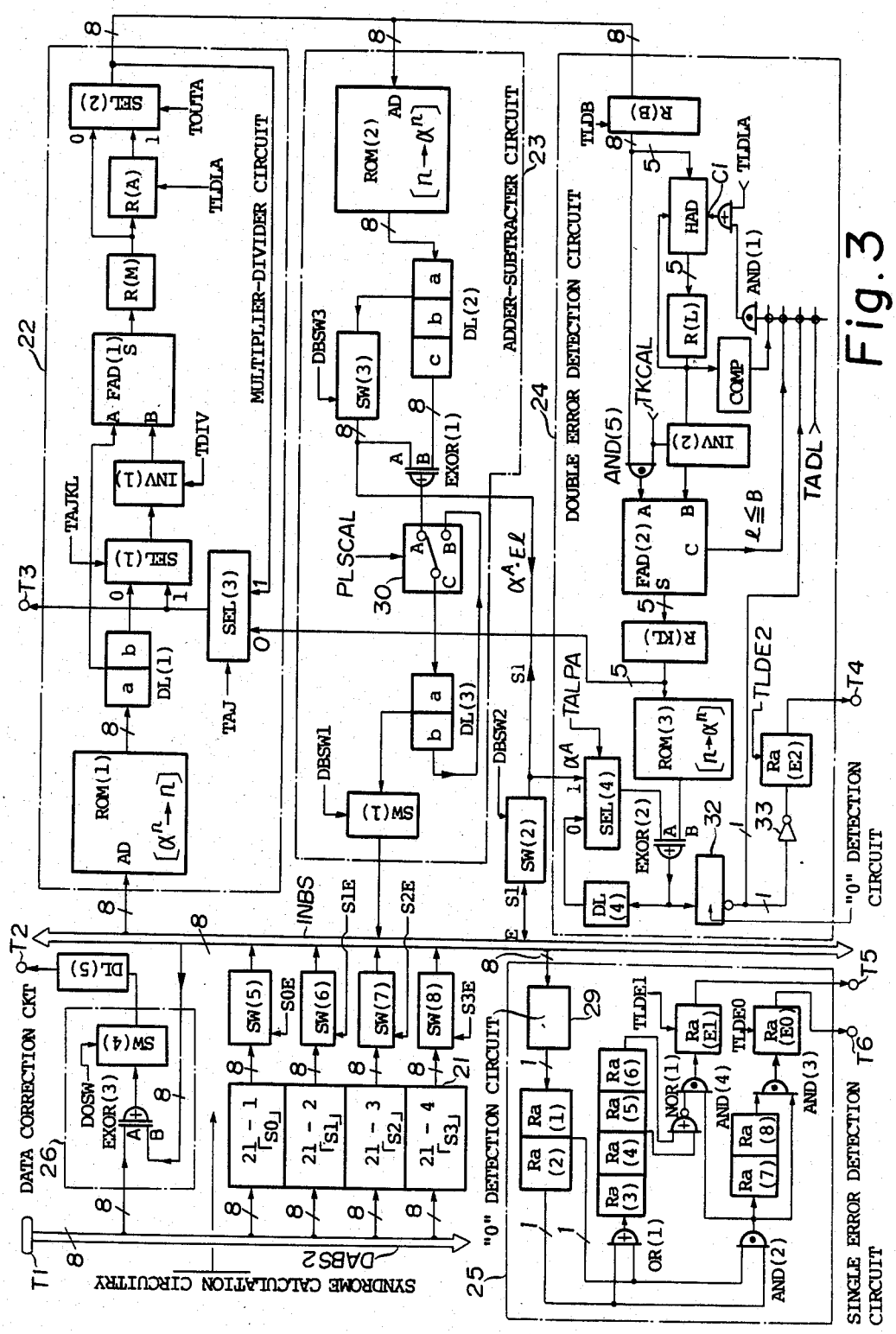
FIG. 3 is a block diagram of the error detection and correction circuit.

FIG. 2 is a block diagram of a main portion of a digital audio disc (DAD) player (Compact Disc Player) incorporating a data error detection and correction circuit 1 provided in accordance with the present invention. The format of data stored in a disc is the same as that shown in FIG. 1.

A signal INP, read out from the disc through an associated optical system, is applied to a receiver circuit 2, the signal INP being modulated in an EFM fashion. The receiver circuit 2 outputs a signal, representative of data bits contained in the INP signal, to an EFM (eight-to-fourteen modulation) demodulation circuit 3. Also, the receiver circuit 2 applies a frame synchronization signal VFSYNC, corresponding to the synchronization pattern SYNC contained in the signal INP, to an address control circuit 8. The EFM demodulation circuit 3 functions to convert an EFM-modulated symbol, i.e., data composed of 14 bits, to the original symbol, i.e., data composed of 8 bits, and outputs this demodulated data to a buffer register 4. The buffer register 4 serves to temporarily store the data serially fed sequentially thereto from the EFM demodulation circuit 3, and comprises a serial-to-parallel data converter for converting the serial output data of the EFM demodulation circuit 3 to parallel data, and a plurality of registers. The output of the buffer register 4 is applied to a gate circuit 7. A write control circuit 5 serves to control the writing and reading operating of the buffer register 4. The write control circuit 5 is responsive to output data EFMD of the address control circuit 8 for feeding a control signal WE to both a read/write control terminal R/W of a random access memory (RAM) 6 and a control terminal of the gate circuit 7, so that the data writing of the RAM 6 is enabled and that the gate circuit 7 is opened. Therefore, the data are sequentially fed from the buffer register 4 through the gate circuit 7 and a data bus DABS1 and are written respectively into addresses of the RAM 6 designated by the address control circuit 8. When the data are outputted from the buffer register 4 to the RAM 6, the write control circuit 5 feeds a control signal VSYMB to the address control circuit 8. The RAM 6 stores the data read out from the disc, that is, the signal data W0 to W27 and the parity data P0 to P3, and address data are applied to a terminal AD of the RAM 6 from the address control circuit 8 to address the RAM 6. The data read out from the RAM 6 are delivered to an output data bus DABS2. In accordance with the frame synchronization signal VFSYNC, the control signal VSYMB and the control signal EFMD, the address control circuit 8 addresses the RAM 6 to write the data thereinto and to read therefrom the data W0 to W27 and P0 to P3 necessary for the data error correction. Also, in accordance with data j, k, l, representative of the position of incorrect data, outputted from the data error detection and correction circuit 1 the address control circuit 8 designates the addresses of RAM 6 in which the incorrect data are stored.

Under the control of the address control circuit 8, the data are outputted sequentially from the RAM 6 to the data error detection and correction circuit 1 in which the data are detected and corrected with a Reed Solomon code method if any error exists in the data.

A timing signal control circuit 9 generates timing signals for controlling the data error detection and correction circuit 1, the address control circuit 8 and other circuits of the disc player. This control circuit 9 comprises a timing signal generator 27 for controlling the data error detection and correction circuit 1, as shown in FIG. 4.

The data error detection and correction circuit 1 will now be described.

(I) Construction and function of data error detection and correction circuit 1

Figure 4:
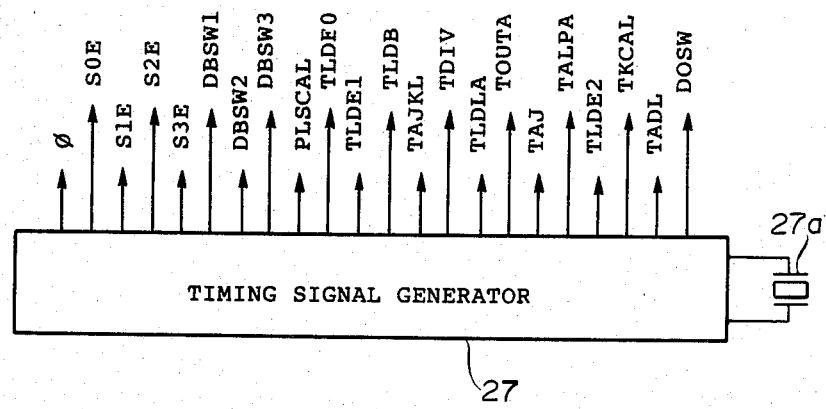
FIG. 4 is a diagrammatical illustration showing a timing signal generator.

FIGS. 3 and 4 shows block diagrams of the data error detection and correction circuit 1. First, reference characters used in FIG. 3 should read as follows:

ROM: read only memory
FAD: full adder
INV: inverter
SEL: selector
R: 8-bit register
DL: delay register (8 bits)
EXOR: exclusive OR gate
SW: switching circuit
HAD: half adder
COMP: comparator
Ra: 1-bit register
AND: AND gate
OR: OR gate
NOR: NOR gate As shown in FIG. 3, the data error detection and correction circuit 1 comprises a syndrome calculation circuitry 21, a multiplier-divider circuit 22, an adder-subtracter circuit 23, a double error detection circuit 24, a single error detection circuit 25, a data correction circuit 26 and the timing signal generator 27 (FIG. 4).

(1) Syndrome calculation circuitry 21

The syndrome calculation circuitry 21 functions to calculate syndromes S0 to S3 shown in the formula (2), and comprises syndrome calculation circuits 21-1 to 21-4. The syndrome calculation circuit 21-1 sequentially accumulates the data W0 to W27 and P0 to P3, stored in one frame Fr and fed thereto through the data bus DABS2 (FIG. 2), to obtain syndrome S0 (8 bits), and stores the result of this calculation and outputs it to SW (5). Similarly, the syndrome calculation circuit 21-2 multiplies the data W0 to W27 and P0 to P3 by $\alpha^n$ (n=0 to 31), respectively, and accumulates the results of these multiplications to obtain syndrome S1, and stores the result of this calculation and outputs it to SW (6). Similarly, the syndrome calculation circuits 21-3 and 21-4 calculate syndromes S2 and S3 and output their calculation results to SW (7) and SW (8), respectively.

(2) Multiplier-divider circuit 22

The multiplier-divider circuit 22 performs syndrome multiplications such as those shown in the formulas (5) and (6), syndrome divisions such as that shown in the formula (11), and syndrome multiplication-divisions such as that shown in the formula (18). The construction and function of the circuit 22 will now be described.

(2-1) ROM (1)

ROM (1) functions to numerically convert data D applied to the address terminal AD thereof through an internal bus INBS. More specifically, ROM (1) converts $\alpha^x$ to X in respect of 8-bit data D on condition that $\alpha^x$ is a primitive element for GF ($2^8$). This conversion is hereinafter referred to as lg[D] (lg[D] has been stored in address D of ROM (1)). ROM (1) is provided for performing multiplications and divisions of syndromes by means of additions and subtractions, and this conversion by ROM (1) is also necessary when obtaining j from the formula (11).

(2-2) DL (1)

DL (1) is a delay register composed of two 8-bit registers a and b, and the input data is shifted from its input through the registers a and b to its output in accordance with the clock pulses $\phi$ (FIG. 4).

(2-3) INV (1)

INV (1) functions as an inverter when a control signal TDIV is in the "1" state, and when the control signal TDIV is in the "0" state, INV (1) does not serve as an inverter and outputs the same signal as its input signal. INV (2) incorporated in the double error detection circuit 24 is of the same construction as INV (1).

(2-4) FAD (1)

FAD (1) performs the adding and subtracting of the numerically converted data. When INV (1) does not serve as an inverter as mentioned above, FAD (1) functions as an adder, and when INV (1) serves as an inverter, FAD (1) functions as a subtracter. Substantially, FAD (1) performs the multiplication and division of the data.

(3) Adder-subtracter circuit 23

The adder-subtracter circuit 23 performs subtractions such as "$S1^2 - S0 \cdot S2$" necessary to determine whether the formula (5) is established, and also performs additions such as the additions of the right members of the formulas (14) and (15). The calculation of syndromes S0 to S3 is effected by a modulo 2 sum method. More specifically, the addition is effected by the exclusive-OR operation of the bits of each of syndromes S0 to S3.

Therefore, the addition is effected without carry, and the addition and the subtraction are operated in the same manner. The construction and function of the adder-subtracter circuit 23 will now be described.

(3-1) ROM (2)

ROM (2) functions to convert the numerically-converted data lg[D] to its original data D, and when the data lg[D] is applied to address terminal AD thereof, ROM (2) outputs the data D to DL (2).

(3-2) DL (2)

DL (2) is a delay register composed of 8-bit registers a, b and c, and the input data is shifted from its input through the registers a, b, and c to its output in accordance with clock pulses $\phi$.

(3-3) EXOR (1)

This is an exclusive OR gate for performing exclusive-OR operation, i.e., modulo 2 sum.

(3-4) Switch 30

When a control signal PLSCAL is in the "1" state, terminals C and A of the switch 30 are connected together, and when the control signal PLSCAL is in the "0" state, terminals C and B of the switch 30 are connected together.

(4) Double error detection circuit 24

The double error detection circuit 24 functions to determine whether two errors exist in the data W0 to W27 and P0 to P3.

(4-1) HAD

HAD is a circuit for adding "1" to a half of the output of 8-bit register R(B) in accordance with the control signal TLDLA. More specifically, the 2nd to 6th bits of R(B) from the LSB or the output of R(L) are fed as input data to HAD, and HAD adds "1" to this data and produces an output data representative of the result of this addition. Actually, 5 bits out of the output of R(B) are used as the input data for HAD because the two uppermost bits are "0".

(4-2) R (L)

R(L) is a 5-bit register for temporarily storing the output of HAD.

(4-3) COMP

COMP is a comparator which compares the output of the register R (L) with a reference constant of 31. When the output of the register R (L) is "31" or more, the comparator COMP outputs "0" signal. And when the output of the register R (L) is less than "31", the comparator COMP outputs "1" signal.

(4-4) FAD (2)

FAD (2) is a full adder which adds the data applied respectively to its input terminals A and B and outputs a signal, representative of the result of this addition, at its output terminal S. Also, FAD (2) outputs "1" signal at its terminal C when the data applied to the terminal B is less than the data applied to the terminal A. On the other hand, when the data at the terminal B is equal to or greater than the data at the terminal A, FAD (2) outputs "0" signal at the terminal C.

(4-5) ROM (3)

ROM (3) functions to convert the numerically-converted data to the original data, as described above for ROM (2).

(4-6) Ra (E2)

This is a 1-bit flag register into which "1" signal is written when a double error is detected. This "1" signal is outputted to an error flag detection circuit 10 (FIG. 2) as E2 flag through a terminal T4.

(5) Single error detection circuit 25

9

This circuit serves to determine whether a single error exists in the data W0 to W27 and P0 to P3.

(5-1) "0" detection circuit 29

This circuit determines whether its input data is "0". This circuit outputs "1" signal when the input signal is "0", and also outputs "0" signal when the input signal is not "0".

(5-2) Ra (E0)

This is a one-bit flag register into which "1" signal is written when the formula (3) is established. This "1" signal is outputted to the error flag detection circuit 10 as E0 flag through a terminal T6.

(5-3) Ra (E1)

This is a one-bit flag register into which "1" signal is written when a single error is detected. This "1" signal is outputted to the error flag detection circuit 10 as E1 flag through a terminal T5.

(6) Data correction circuit 26

This circuit performs the calculations indicated by the formulas (12), (19) and (20). The data error Ej, Ek and El, fed through the internal bus INBS, are added respectively to the data Wj, Wk and Wl, fed through the data bus DABS2, by EXOR (3). These addition results <Wj>, <Wk> and <Wl> are applied to DL (5) and to RAM 6 (FIG. 2) through a terminal T2.

(7) Timing signal generator 27

This generator is part of the timing signal control circuit 9, and generates clock pulses $\phi$ in accordance with the natural frequency of a crystal oscillator 27a. This generator outputs various control signals S0E, S1E and so on (FIGS. 5 to 7) based on the clock pulse $\phi$, the clock pulse $\phi$ and the control signals being applied to the circuits of FIG. 3.

(II) Operation

The operation of the data error detection and correction circuit 1 will now be described with reference to timing charts shown in FIGS. 5 to 7.

Figure 5:
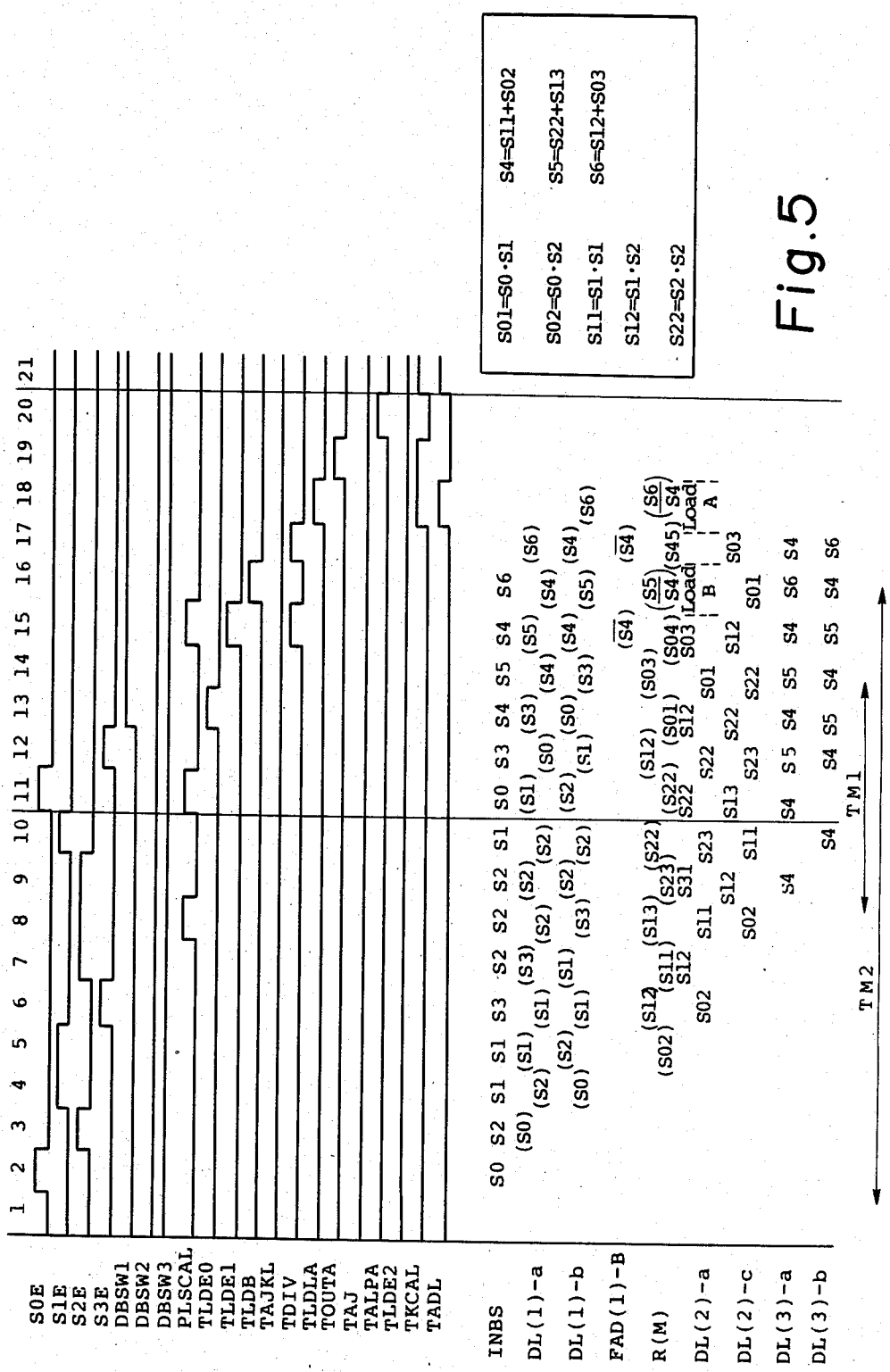
FIGS. 5 to 7 are a timing chart showing the operation of the error detection and correction circuit.
Figure 6:
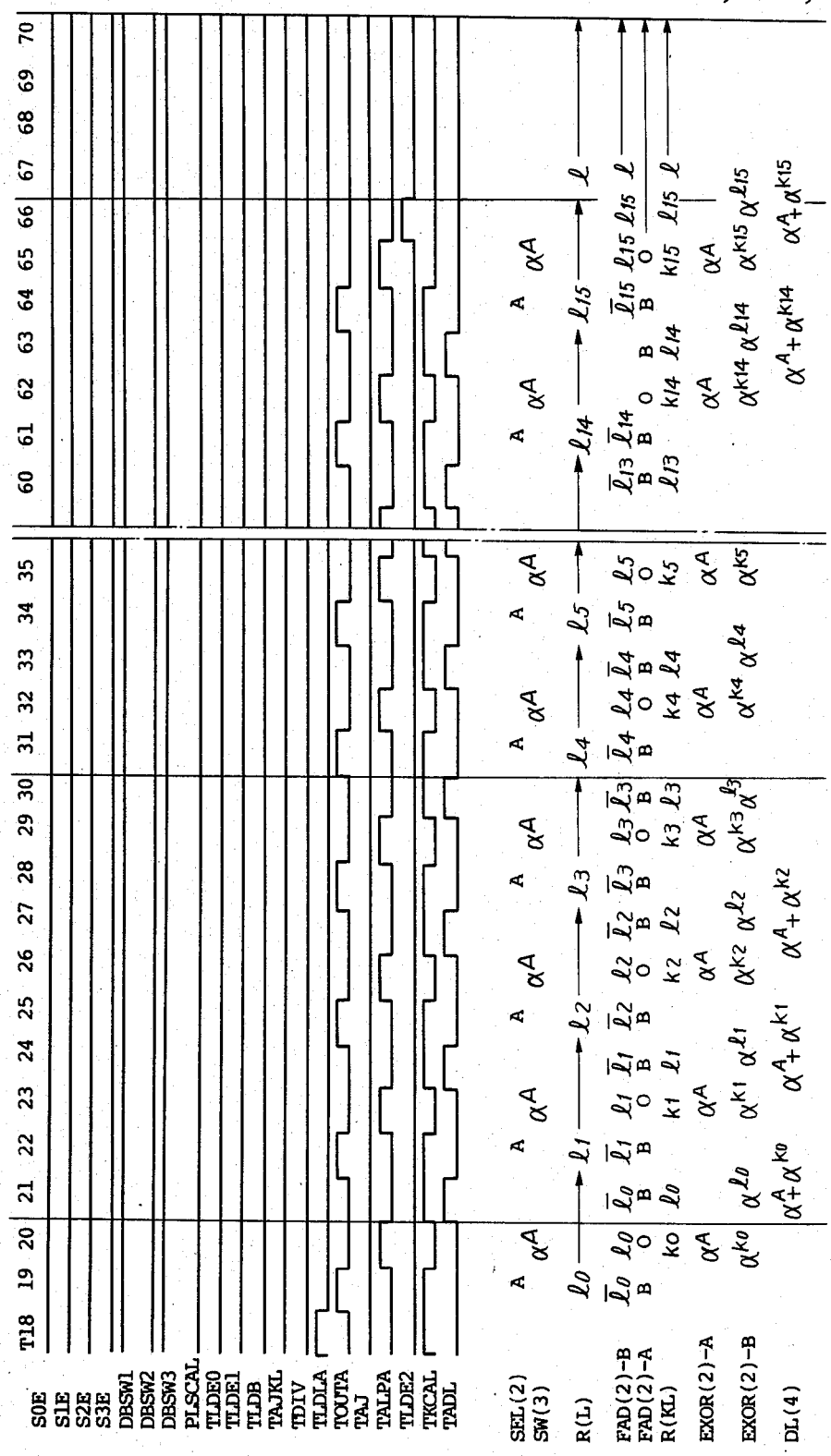
Figure 7:
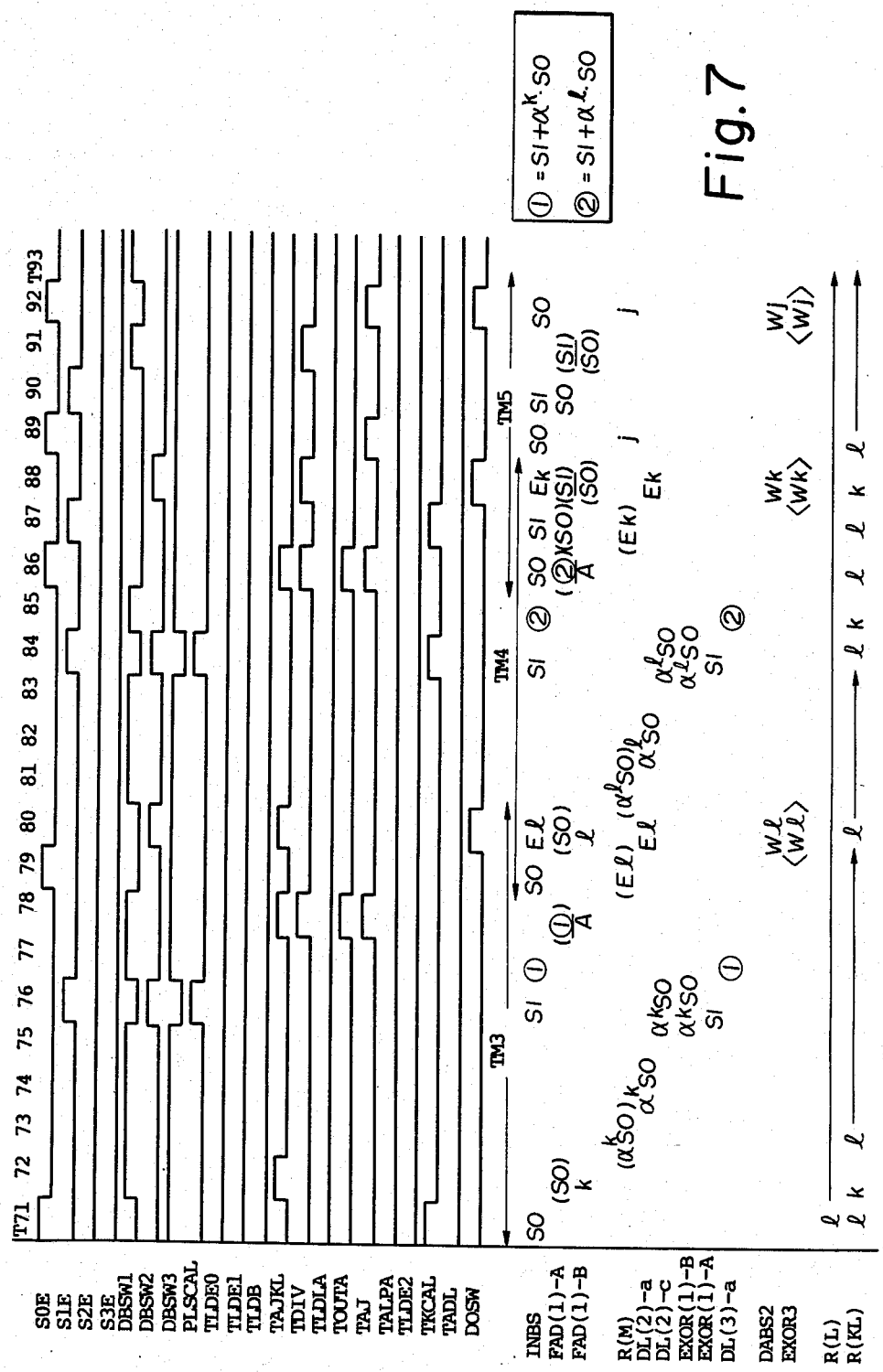

The data error detection and correction circuit 1 performs the detection and correction of data error in the data W0 to W27 and P0 to P3 in one frame Fr during a time interval between a time slot T1 to a time slot Ta3 shown in FIGS. 5 to 7. The leading edge of slot T1 is the time at which the calculation of syndromes S0 to S3 at the syndrome calculation circuits 21-1 to 21-4 of the syndrome calculation circuitry 21 is completed. Slots T1 to T93 are based on the clock pulses $\phi$. In other words, the clock pulses $\phi$ rise up at boundaries of time slots T1 to T93. Waveforms of the control signals S0E, S1E and so on shown in FIG. 4 are illustrated in FIGS. 5 to 7, and high level represents "1" signal while low level represents "0" signal. For example, with reference to FIG. 5, the control signal S0E is in the "1" state at the time slots T2 and T11. Therefore, SW (5) in FIG. 3 is rendered to open at the slots T2 and T11 so that the data representative of syndrome S0 is fed to the internal bus INBS. Also, for example, the signal PLSCAL is rendered "1" at the time slots T8, T11 and T15. Therefore, terminals C and A of switch 30 (FIG. 3) are connected together at the slots T8, T11 and T15, and terminals C and B of the switch 30 are connected together during the time slots T1 to T21 except for the slots T8, T11 and T15.

In FIGS. 5 to 7, the data at the input and output terminals of the circuits of FIG. 3 and the data on the buses are shown below the waveforms. For example, with reference to FIG. 5, INBS designates the data on the internal bus INBS, and FAD (1)-B designates the data at the input terminal B of the full adder FAD (1)

10

(FIG. 3). Also, R (M) designates the output data of the register R (M). The waveforms of the control signals during a time interval between slots T18 and T21 are shown both in FIGS. 5 and 6.

In FIGS. 5 to 7, the characters in parentheses represent the numerically converted data. For example, (S1) represents lg[S1] which is numerically converted from syndrome S1 through ROM (1) (FIG. 3). The explanation of S01, S02, S11, S12 and S22 is given in a block in FIG. 5.

The process of the data error detection and correction will now be described.

(1) Determination of data error (see item ①)

This determination is effected during a time period TM1 (FIG. 5) between the time slots T9 and T13. More specifically, the data representative of syndrome S2 is applied to the internal bus INBS at the slot T9, so that the "0" detection circuit 29 of the single error detection circuit 25 determines whether syndrome S2 is "0" and outputs data representative of the result of this determination. The data representative of this determination result is outputted from Ra (1) at the next time slot T10, as shown in FIG. 8. Also, the data representative of syndrome S1 is applied to the internal bus INBS at the slot T10, so that the "0" detection circuit 29 determines whether syndrome S1 is "0" and outputs data representative of the result of this determination. The data representative of this determination result is outputted from Ra (1) at the next time slot T11. At this time, Ra (2) outputs the data representative of this determination result shifted from Ra (1) thereto. Therefore, AND (2) outputs a signal representative of a logical multiplication of the determination results of syndromes S2 and S1 (FIG. 8). Similarly, at the time slot T13, AND (2) outputs a signal representative of a logical multiplication of determination results of syndromes S0 and S3 as shown in FIG. 8, and at this time Ra (8) outputs data representative of a logical multiplication of determination results of syndromes S1 and S2. Therefore, AND (3) outputs a signal representative of logical multiplies of determination results of syndromes S0 to S3. As a result, when all of syndromes S0 to S3 are "0", that is to say, there is no data error, the output signal of AND (3) is "1" at the time slot T13. On the other hand, when a value other than "0" is present in any of syndromes S0 to S3, that is to say, there is any data error, the output signal of AND (3) is in the "0" state. The output of AND (3) is loaded onto Ra (E0) by a control signal TLDE0 which is rendered "1" at the slot T13, and is applied as E0 flag to a terminal T6. Thus, whether there is any data error is determined by this E0 flag.

(2) Detection of single data error (see item ②)

This detection is effected during a time period TM2 (FIG. 5) between the time slots T2 and T15. The data representative of syndrome S0 is fed to the internal bus INBS at the slot T2, and the data (S0) is outputted at the slot T2 from ROM (1) to DL (1)-a which in turn outputs the data (S0) at the next time slot T3 (see FIG. 5). Also, the data representative of syndrome S2 is fed to the internal bus INBS at the time slot T3, and ROM (1) outputs data (S2) to DL (1)-a at the slot T3. Therefore, at the next time slot T4, the data (S2) and (S0) are fed to DL (1)-a and DL (1)-b, respectively. At this slot T4, the control signal TAJKL fed to SEL (1) and the control signal TAIV fed to INV (1) are both in the "0" state. Therefore, the output of DL (1)-b is fed to INV (1) through SEL (1), and INV (1) outputs the same signal as its input signal. Therefore, at the time slot T4, the output of DL (1)-a is fed to the input terminal A of FAD (1) while the output of DL (1)-b is fed to the input terminal B of FAD (1), so that FAD (1) outputs data (S2)+(S0), that is, data (S02). At the next time slot T5, the data (S02) is outputted from R (M) (see FIG. 5). At this slot T5, the control signal TOUTA for SEL (2) is in the "0" state, and therefore at this slot T5 the output data (S02) of R (M) is fed to the address terminal AD of ROM (2) through SEL (2) so that ROM (2) outputs data S02. Data S02 is outputted from DL (2)-a at the next time slot T6, from DL (2)-b at the time slot T7, and from DL (2)-c at the time slot T8 sequentially, and at the slot T8 this data S02 is fed to the input terminal B of EXOR (1). Similarly, at the slot T6, data (S1) is outputted from each of DL (1)-a and DL (1)-b, so that FAD (1) outputs data (S11). At the slot T7, the data (S11) is outputted from R (M) so that ROM (2) outputs data S11. Also, at the slot T8, the data S11 is outputted from DL (2)-a. At the slot T8, the control signal DBSW3 for SW (3) is in the "1" state, so that SW (3) is in its open state. As a result, at the time slot T8, data S11 and data S02 are fed respectively to the input terminals A and B of EXOR (1), so that EXOR (1) outputs data S11+S02, i.e., data S4. Also, at this time slot T8, the control signal PLSCAL for the switch 30 is in the "1" state, and its terminals C and A are connected together. Therefore, at the slot T8, data S4 is fed to the input terminal of DL (3)-a, and at the next time slot T9, data S4 is outputted from DL (3)-a (see FIG. 5). Then, at the time slot T10, the data S4 is outputted from DL (3)-b. At this time, the control signal PLSCAL is in the "0" state, so that the data S4 is fed to the input terminal of DL (3)-a. Then, the data S4 is again outputted from DL (3)-a at the time slot T11, from DL (3)-b at the time slot T12 and again from DL (3)-a at the time slot T13. At this time slot T13, the control signal DBSW1 for SW (1) is in the "1" state, so that the data S4 outputted from DL (3)-a is fed to the internal bus INBS through SW (1) (see FIG. 5). Thus, at the slot T13, the data S4 is fed to the internal bus INBS. Similarly, data S5 is fed to the internal bus INBS at the time slot T14.

The formulas (5) and (6) can be modified in the modulo 2 sum calculation in the following manner:

$$S1^2 - S0 \cdot S2 = S1^2 + S0 \cdot S2 \quad (21)$$
$$= S4 = 0$$
$$S2^2 - S1 \cdot S3 = S2^2 + S1 \cdot S3 \quad (22)$$
$$= S5 = 0$$

During a time period between the time slots T9 and T15, the single error detection circuit 25 determines whether each of the formulas (7) to (10), (21) and (22) is established. More specifically, the "0" detection circuit 29 outputs at the slot T9 data representative of the result of determination of whether syndrome S2 is "0" and also outputs at the slot T10 data representative of the result of determination of whether syndrome S1 is "0". Therefore, as shown in FIG. 8, Ra (2) outputs data representative of this determination result of syndrome S2 at the slot T11, and also Ra (1) outputs data representative of this determination result of syndrome S1 at the slot 11. As a result, OR (1) outputs data representative of a logical sum of the determination results of syndromes S2 and S1 at the slot T11. Data representative of this logical sum is outputted from Ra (3) at the slot T12. Similarly, outputs of OR (1), Ra (3), Ra (4), Ra (5) and Ra (6) at the time slots T11 to T15 are as shown in FIG. 8. At the slot T15, Ra (4) outputs data representative of a logical sum of the result of determination of whether syndrome S3 is "0" and the result of determination of whether syndrome S0 is "0". Also, at this slot T15, Ra (6) outputs a logical sum of the result of determination of whether syndrome S1 is "0" and the result of determination of whether syndrome S2 is "0". Therefore, the output of NOR (1) at the slot T15 represents negation of the logical sums of determination results of syndromes S0 to S3, and only when these determination results are all "0", the output of the NOR (1) is in the "1" state. In other words, only when all of the formulas (7) to (10) are established, the output of NOR (1) is in the "1" state.

As is clear from FIG. 8, the output of AND (2) at the slot T15 represents a logical multiplication of the result of determination of whether syndrome S4 is "0" and the result of determination of whether syndrome S5 is "0", and therefore only when syndromes S4 and S5 are both "0", the output of AND (2) is in the "1" state. In other words, this output is in the "1" state only when both of the formulas (5) and (6) are established.

As a result, the output of AND (4) is in the "1" state only when the formulas (5) to (10) are all established, and when any one of these formulas is not established, the output of AND (4) is in the "0" state. The output of AND (4) is loaded onto Ra (E1) by the control signal TLDE1 and outputted therefrom to the terminal T5 as E1 flag. Thus, in accordance with this E1 flag, it is determined whether there is any single data error.

(3) Detection of double data error (see item ④)

As described in the item ④, the detection of double data error is effected by obtaining values of a set of k and l which satisfy the formulas (14) to (17). The formulas (14) and (15) are represented in the following manner, using the characters mentioned in the block in FIG. 5.

$$\alpha^k + \alpha^l = S6/S4 \quad (23)$$

$$\alpha^k \cdot \alpha^l = S5/S4 \quad (24)$$

If the right members of the formulas (23) and (24) are replaced by $\alpha^A$ and $\alpha^B$, respectively, the following formulas are obtained:

$$\alpha^k + \alpha^l = S6/S4 = \alpha^A \quad (25)$$

$$\alpha^k \cdot \alpha^l = S5/S4 = \alpha^B \quad (26)$$

The following formula (27) is obtained from the formula (25):

$$\alpha^k + \alpha^l + \alpha^A = 0 \quad (27)$$

Also, the following formula (28) is obtained from the formula (26):

$$B = k + l \quad (28)$$

Thus, to obtain the values of k and l which satisfy the formulas (14) to (17) means to obtain the values of k and l which satisfy the formulas (16), (17), (27) and (28).

It will be appreciated that the above values A and B can be calculated from syndromes S0 to S3.

Figure 9:
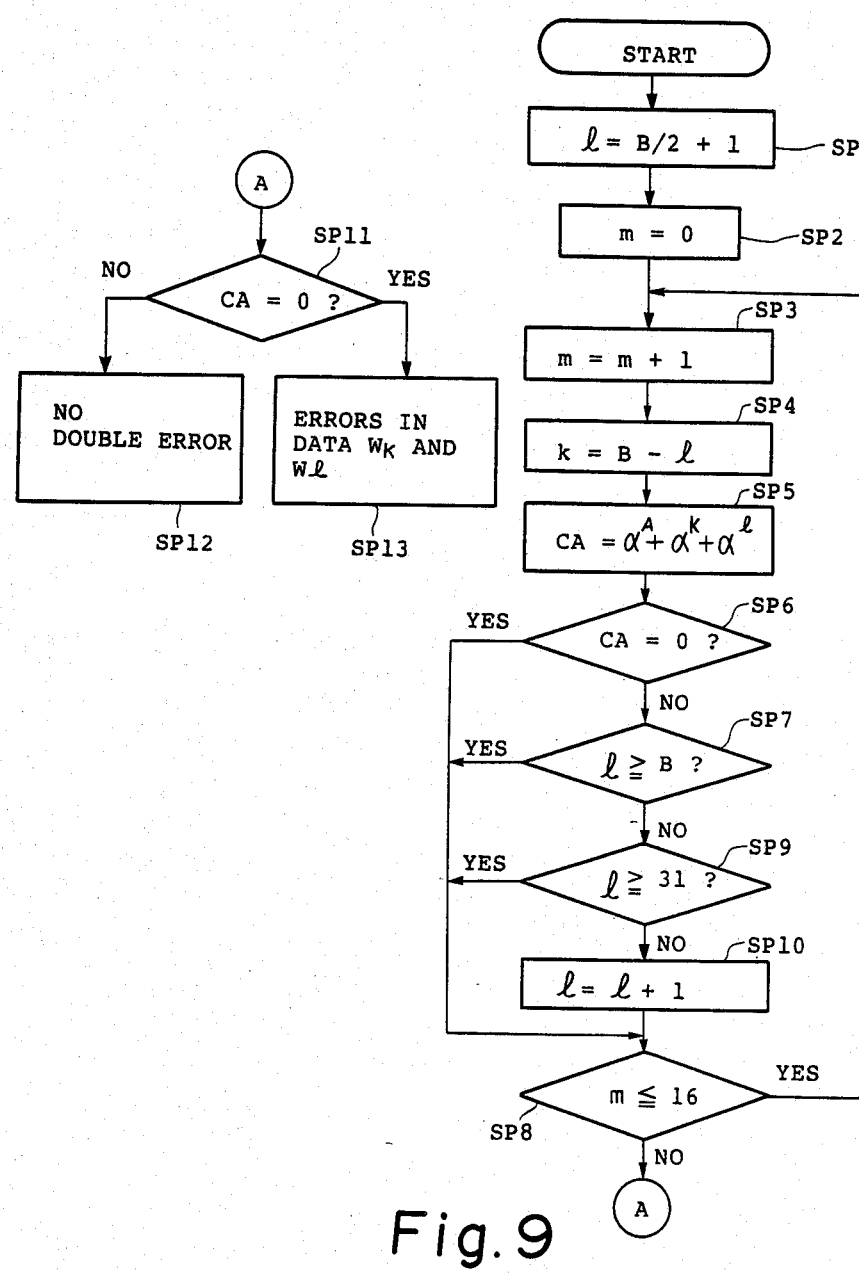
FIG. 9 is a flow chart of the operation of the data error detection and correction circuit; showing the detection of a double error.

The process of the double data error detection will now be described with reference to a flow chart of FIG. 9.

First, it is assumed that l is represented by "B/2+1" at stage SP1, and then it is assumed that m is represented by "0" at stage SP2, m being an imaginary counter. Then, m is subjected to increment at stage SP3. Then, the value of k is calculated from the formula (28) at stage SP4. Then, at stage SP5, the values of l and k are inserted into the left member of the formula (27), and the left member of the formula (27) is calculated to obtain a calculation result CA. At the next stage SP6, it is determined whether CA is "0". If the result is "NO", then the processing proceeds to stage SP7 while if the result is "YES", the processing proceeds to stage SP8. At stage SP7, it is determined whether "l≧B" is established, and if the result is "NO", the processing proceeds to stage SP9. On the other hand, if the result is "YES", the processing proceeds to stage SP8. At stage SP9, it is determined whether l≧31 is established, and if the result is "NO", the processing proceeds to stage SP10. On the other hand, if the result is "YES", the processing proceeds to stage SP8. At stage SP10, the value of l is subjected to increment. Then, at stage SP8, it is determined whether "m≦16" is established, and if the result is "YES", the processing returns to stage SP3. On the other hand, if the result is "NO", the processing proceeds to stage SP11. At stage SP11, it is again determined whether the value of CA is "0", and if the result is "NO", it is decided at stage SP12 that there is no double error. On the other hand, if the result is "YES", it is decided at stage SP13 that there are errors in data Wk and Wl.

As described above, for the double error detection, it is first assumed that l is represented by "B/2+1", and then the value of k is obtained from the formula (28). Then, the values of k and l are inserted into the formula (27) to determine whether this formula is established. Similarly, it is assumed that l is represented by "B/2+2", "B/2+3" and so on, so that the values of k and l which satisfy the formulas (27) and (28) are obtained. In this case, l is greater than B/2 (l>B/2) while k is less than B/2 (k<B/2), and therefore the formula (17) is established. The determination of whether the formula (27) is established is carried out only when l<B (stage 7) and l<31 (stage 9) are established. Therefore, the values of k and l so obtained satisfy the formula (16). The total number of the data W0 to P3 is 32, and therefore if l is changed sixteen times, it can be determined whether there is a set of k and l. Therefore, the processing at stages SP3, SP4 - - - SP8 is repeated sixteen times (see stage SP8).

The double error detection circuit 24 effects the double data error detection according to the above procedure. The operation of the circuit 24 will now be described.

As described above, the data S4 and S5 are fed to the internal bus INBS at the time slots T13 and T14 (FIG. 5), respectively, and the data S4 and S6 are fed to the internal bus INBS at the slots T15 and T16, respectively. The reason that the data S4, S5, S4 and S6 are sequentially fed to the internal bus at the slots T13, T14, T15 and T16 is described above and will be clear from the timing chart of FIG. 5. More specifically, the reason is that the control signal DBSW1 is rendered "1" from the slot T13 and that the control signal PLSCAL once goes to the "1" state at the slot T15. When the data S4 is fed to the internal bus INBS at the slot T13, ROM (1) outputs data (S4), and the data (S4) is outputted from DL (1)-a at the slot T14. When data S5 is fed to the internal bus INBUS at the slot T14, ROM (1) outputs data (S5), and the data (S5) is outputted from DL (1)-a at the slot T15. Also, at the slot T15, the data (S4) is outputted from DL (1)-b. At the slot T15, the control signal TAJKL is in the "0" state and the control signal TDIV is in the "1" state. The data (S4) is therefore fed from DL (1)-b via SEL (1) and INV (1) to the input terminal B of FAD (1). As a result, the output of FAD (1) is data "(S5)−(S4)", i.e., (S5/S4), and the data (S5/S4) is outputted from R (M) at the slot T16. At the slot T16, the control signal TOUTA is in the "0" state, so that the data (S5/S4) is fed from R (M) to R (B) via SEL (2). At this time, the control signal TLDB is in the "1" state, so that the data (S5/S4) outputted from R (M) at the slot T16 is loaded onto R (B) at the same slot T16. Thereafter, the data (S4/S5) is held in R (B) until the processing is completed, i.e., until the slot T93. It will be clear from the formula (26) that the data (S5/S4) is the data B.

Then, according to a procedure similar to that described above, data (S6/S4) is loaded onto R (A) at the time slot T18, and this data is stored in R (A) until the slot T93. It will be clear from the formula (25) that the data (S6/S4) is the data A.

In this manner, at the slot T18, the data A and B are stored in R (A) and R (B), respectively. During a time period between the time slots T18 and T66, the double data error detection is carried out (FIG. 6).

More specifically, at the slot T18, the data B is fed to the input terminal of HAD whereupon data "B/2+1" is outputted from HAD by the control signal TLDLA. The data "B/2+1" is loaded onto R (L) at the slot T18. At the next time slot T19, R (L) outputs data "B/2+1" (hereinafter referred to as "lo"). At this time, the control signal TKCAL is in the "1" state, and therefore AND (5) is opened and INV (2) functions as an inverter. As a result, at the slot T19, the data B is fed to the input terminal A of FAD (2) and data $\overline{lo}$ (negation of lo) is fed to the input terminal B of FAD (2), so that FAD (2) outputs data "B−lo", i.e., data ko (stage SP4 of FIG. 9). The data ko is outputted from R (KL) at the next slot T20 and fed to ROM (3), so that ROM (3) outputs data $\alpha^{ko}$ at the slot T20 to the input terminal B of EXOR (2).

Also, the control signal TOUTA is turned to the "1" state at the slot T19, and the data A is outputted from R (A) to the input terminal of ROM (2) via SEL (2), so that ROM (2) outputs data $\alpha^A$.

The data $\alpha^A$ is outputted from DL (2)-a at the next time slot T20 and fed to SEL (4) via SW (3). At this time, the control signal TALPA for SEL (4) is in the "1" state, so that the data $\alpha^A$ is fed to the input terminal A of EXOR (2) via SEL (4) at the slot T20. As a result, at the slot T20, the output of EXOR (2) is "$\alpha^A + \alpha^{ko}$", and the data "$\alpha^A + \alpha^{ko}$" is outputted from DL (4) at the next slot T21.

Also, at the time slot T20, the control signal TKCAL is in the "0" state, and AND (5) is opened, and INV (2) outputs the same signal as its input signal. As a result, at the slot T20, data "0" is fed to the input terminal A of FAD (2) while data lo is fed to the input terminal B of FAD (2), so that FAD (2) outputs data lo. The data is outputted from R (KL) to ROM (3) at the next slot T21 so that ROM (3) outputs data $\alpha^{lo}$ to the input terminal B of EXOR (2).

Also, at the time slot T21, the control signal TALPA is in the "1" state, so that data "$\alpha^A + \alpha^{ko}$" is outputted from DL (4) to the input terminal A of EXOR (2). As a result, at the slot T21, the output of EXOR (2) is "$\alpha^A+\alpha^{ko}+\alpha^{lo}$" (stage SP5 of FIG. 9), and the data "$\alpha^A+\alpha^{ko}+\alpha^{lo}$" is fed to the input terminal of "0" detection circuit 32. The "0" detection circuit 32 outputs "0" signal when the output of EXOR (2) is in the "0" state, and outputs "1" signal when the output of EXOR (2) is other than "0" signal (stage SP6 of FIG. 9). At this time, when the data "$\alpha^A+\alpha^{ko}+\alpha^{lo}$" is not "0", the "0" detection circuit 32 outputs "1" signal to the input terminal of AND (1) at the slot T21.

Also, at the slot T21, the control signal TADL is in the "1" state, and this control signal is fed to the input terminal of AND (1). At the slot T21, lo<31 and lo≦B are established, so that "1" signals are outputted from COMP and the terminal C of FAD (2), respectively, and therefore AND (1) outputs "1" signal at the slot T21 which is fed to HAD as a carry signal. Therefore, "1" is added to the output of R (L) so that HAD outputs data "lo+1" (hereinafter referred to as l1), and the data l1 is outputted from R (L) at the next slot T22.

During a time period between the time slots T22 and T24, a time period between the time slots T25 and T27, - - - a time period between the time slots T64 and T66, the above procedure is repeated. Data "$\alpha^A+\alpha^{k1}+\alpha^{l1}$", data "$\alpha^A+\alpha^{k2}+\alpha^{l2}$", - - - data "$\alpha^A+\alpha^{k15}+\alpha^{l15}$" are outputted from EXOR (2) at the slots T24, T27 ... T66, respectively. The "0" detection circuit 32 outputs data representative of the determination of whether each of the data outputted from EXOR (2) is "0".

The above description and the data l1, k1 - - - are based on the assumption that the output of EXOR (2) is not rendered "0" until the time slot T66. If the output of EXOR (2) is rendered "0" before the slot T66, that is to say, there is a set of k and l which satisfy the above formulas (16), (17), (27) and (28), the processing is as follows:

For example, if the data "$\alpha^A+\alpha^{k1}+\alpha^{l1}$" outputted from EXOR (2) at the slot T24 is "0", the "0" detection circuit 32 outputs "0" signal to the input terminal of AND (1) at the same slot T24. As a result, even if the control signal TADL goes to the "1" state at the slot T24, the output of AND (1) remains "0", so that the data stored in R (L) is not subjected to increment. Therefore, at the slot T27, the data "$\alpha^A+\alpha^{k1}+\alpha^{l1}$" is again outputted from EXOR (2) and "0" signal is outputted from the "0" detection circuit 32. Then, this procedure is repeated. More specifically, if the data "$\alpha^A+\alpha^{k1}+\alpha^{l1}$" outputted from EXOR (2) at the slot T24 is "0", the content of R (L) continues to be l1 thereafter, and R (KL) outputs data k1 at the slots T26, T29 - - - T65 and outputs data l1 at the slots T27, T30 - - - T66. Also, EXOR (2) outputs the data "$\alpha^A+\alpha^{k1}+\alpha^{l1}$" at the slots T27, T30 - - - T66, and the "0" detection circuit 32 outputs "0" signal at the slots T27, T30 - - - T66. When the "0" detection circuit 32 outputs "0" signal at the slot T60, the inverter 33 outputs "1" signal which is inputted into Ra (E2) by the control signal TLDE2 which is rendered "1" at the slot T66. The content of Ra (E2) is fed to the terminal T4 as E2 flag. Thus, the double data error detection is carried out by this E2 flag.

If the content of R (L) reaches "31" before the slot T66, or if l≧B is established before the slot T66, "0" signal is outputted from COMP or the terminal C of FAD (2). Therefore, in this case, the content of R (L) is not subjected to increment thereafter (see SP7 and SP9 of FIG. 9).

(4) Correction of double data error (see item ⑤)

The formula (18) is represented in the following manner, using the formula (25):

$$Ek = \{S1+\alpha^l \cdot S0\}/\alpha^A \quad (30)$$

$$El = \{S1+\alpha^k \cdot S0\}/\alpha^A \quad (31)$$

If the values of Ek and El are obtained, errors of the data Wk and Wl can be corrected using the formula (19).

This double data error correction is effected during a time period between the time slots T71 and T88 (FIG. 7). First, the correction of the data Wl is effected during a time period TM3 between the slots T71 and T80. More specifically, at the slot T71, the data representative of S0 is fed to the internal bus INBS so that ROM (1) outputs data (S0). The data (S0) is outputted from DL (1)-a to the input terminal A of FAD (1) at the next slot T72. At the slot T72, the output of R (KL) is data representative of the position of the incorrect data Wk. The reason for this will now be described.

The control signal TKCAL is rendered "0" at the time slot T65 and is kept at the "0" state until the slot T70. When the control signal TKCAL is rendered "0", AND (5) outputs "0" signal to the input terminal A of FAD (2). Also, INV (2) outputs the same signal as its input signal, so that the data l representative of the position of the incorrect data Wl is fed from R (L) to the input terminal B of FAD (2). As a result, the output of FAD (2) represents the data l, and the data l is outputted from R (KL) at the slot T66. Thereafter, the output of FAD (2) continues to be the data l until the slot T70, so that the output of R (KL) continues to be the data l until the slot 71. Then, the control signal TKCAL is rendered "1" at the slot T71 so that FAD (2) outputs data k ($k=B-l$), and the data k is outputted from R (KL) at the next slot T72. The output of R (KL) varies after the slot T72 in the following manner:

First, the control signal TKCAL is rendered "0" at the slot T72, so that the output of FAD (2) at the slot T72 is the data l. Therefore, at the next slot T73, the data l is again outputted from R (KL). Thereafter, at the slots T84 and T87, the control signal TKCAL is rendered "1", so that the output of R (KL) at the slots T85 and T88 is the data k while the output of R (KL) at the other slots is the data l (FIG. 7).

Thus, the output of R (KL) at the slot T72 is the data k, and the control signal TAJ fed to SEL (3) at the slot T72 is "0" signal, the control signal TAJKL fed to SEL (1) at the slot T72 is "1" signal, and the control signal TDIV fed to INV (1) at the slot T72 is "0" signal. Therefore, at the slot T72, the data (S0) is fed to the input terminal A of FAD (1) while the data k is fed to the input terminal B of FAD (1), so that FAD (1) outputs k+(S0), i.e., data ($\alpha^k \cdot$S0). The data ($\alpha^k \cdot$S0) is outputted from R (M) at the next slot T73. The control signal TOUTA in the "0" state is fed to SEL (2) at the slot T73. Therefore, the data ($\alpha^k \cdot$S0) loaded onto R (M) is fed to ROM (2) via SEL (2), and ROM (2) outputs data $\alpha^k \cdot$S0. The data $\alpha^k \cdot$S0 is outputted from DL (2)-a at the next slot T74 and then is outputted from DL (2)-c at the slot T76 to the input terminal B of EXOR (1).

Also, the data representative of syndrome S1 is fed to the internal bus INBS at the time slot T76, and at this time the control signal DBSW2 fed to SW (2) is rendered "1". Therefore, the data representative of syndrome S1 is fed to the input terminal A of EXOR (1) via SW (2) at the slot T76, so that EXOR (1) outputs data "$\alpha^k \cdot S0 + S1$" (hereinafter referred to as data ①) (see FIG. 7). Since the control signal PLSCAL is in the "1" state at the slot T76, the data ① is fed to DL (3) via a switch 30 at this slot and is outputted from DL (3)-a to the internal bus INBS via SW (1) at the next slot T77.

When the data ① is fed to the internal bus INBS at the slot T77, ROM (1) outputs data (①). The data (①) is outputted from DL (1)-a to the input terminal A of FAD (1) at the slot T78. The control signal TOUTA for SEL (2), the control signal TAJ for SEL (3), the control signal TAJKL for SEL (1) and the control signal TDIV for INV (1) are all in the "1" state at the slot T78, and therefore the data A is outputted from R (A) to the input terminal B of FAD (1) via SEL (2), SEL (3), SEL (1) and INV (1). Therefore, at the slot T78, FAD (1) outputs data (①)−A, i.e., data (①/$\alpha^4$). The data (①/$\alpha^4$) is represented by the following formula:

$$① /\alpha^4 = \{S1 + \alpha^k \cdot S0\}/\alpha^4 \quad (32)$$

$$= El$$

Therefore, the output of FAD (1) at the slot T78 is data (El), and the data (El) is outputted at the next slot T79 from R (M) via SEL (2) to ROM (2) which in turn outputs data El. The data El is outputted from DL (2)-a at the next slot T80. At this slot T80, both of SW (3) and SW (2) are opened, so that the data El outputted from DL (2)-a is applied to the input terminal B of EXOR (3) via SW (3), SW (2) and the internal bus INBS.

The control signal TAJ for SEL (3) is in the "1" state at the slot T77, and therefore the output data l of R (KL) is fed to the address control circuit 8 (FIG. 2) via SEL (3) and the terminal T3 at the slot T77. Thus, the data l is inputted into the address control circuit 8 at the slot T77, and the address control circuit 8 outputs address data representative of the address of RAM 6 storing the data Wl at the slot T80 three slots after the slot T77. Therefore, the data Wl is outputted from RAM 6 at the slot T80 to the input terminal A of EXOR (3) via the data bus DABS2. As a result, at the slot T80, EXOR (3) outputs data Wl+El, i.e., the correct data <Wl>. At this time, the control signal DOSW for SW (4) is in the "1" state, and therefore the data <Wl> is fed to DL (5) via SW (4). DL (5) outputs the data <Wl> to the data bus DABS1 (FIG. 2) three slots later, that is, at the slot T80. Also, at the slot T80, the output (data l) is fed from R (KL) to the address control circuit 8 via SEL (3). Thus, the data l is inputted into the address control circuit 8 at the slot T80, and the address control circuit 8 outputs address data, representative of the address of RAM 6 storing the data Wl, to RAM 6 three slots later, that is, at the slot T83. As a result, the data <Wl> is written into RAM 6.

The correction of the data Wl is carried out according to the above procedure. Also, the correction of the data Wk is effected during a time period TM4 between the slots T79 and T88 according to the same procedure. The description of the processing of the correction of the data Wk is omitted, and this will be understood from the time chart of FIG. 7.

(5) Correction of single data error (see item ③)

This correction is effected during a time period between the slots T86 and T92. More specifically, the data representative of syndrome S0 is fed to the internal bus INBS at the slot T86, and then at the slot T87 the data representative of syndrome S1 is fed to the internal bus INBS. Therefore, data (S0) is outputted from DL (1)-a at the slot T87, and the data (S1) and (S0) are outputted from DL (1)-a and DL (1)-b, respectively, at the slot T88. At the slot T88, the control signal TAJKL for SEL (1) is in the "0" state while the control signal TDIV for INV (1) is in the "1" state, and therefore INV (1) outputs data, representative of a complement of the data (S0), to the input terminal B of FAD (1). As a result, at the slot T88, FAD (1) outputs data (S1)−(S0), that is, data (S1/S0) to R (M) which outputs this data at the next slot T89. It will be appreciated from the formula (11) that the data (S1/S0) is the data j representative of the position of the incorrect data Wj. Since the control signal TOUTA for SEL (2) and the control signal TAJ for SEL (3) are "0" and "1", respectively, at the slot T89, the data j is fed to the address control circuit 8 via SEL (2) and SEL (3) at this slot. The data j is inputted into the address control circuit 8, and three slots later, that is, at the slot T92, the address control circuit 8 outputs address data representative of the address of RAM 6 storing the data Wj. Therefore, at the slot T92, the data Wj is read from RAM 6 and fed to the input terminal A of EXOR (3) via the data bus DABS2. Also, at the slot T92, the data representative of syndrome S0, i.e., error data Ej, is fed to the input terminal B of EXOR (3) via the internal bus INBS. Therefore, at the slot T92, EXOR (3) outputs data "Wj+S0", i.e., data <Wj>, to DL (5) via SW (4). DL (5) outputs the data <Wj> to the data bus DABS1 three slots later, i.e., at the slot T95.

The data representative of syndrome S0 is fed to the internal bus INBS at the slot T89, and the data representative of syndrome S1 is fed to the internal bus INBS at the slot T90. Therefore, according to the procedure as described above, the data j is fed at the slot T92 to the address control circuit 8 which in turn outputs data representative of the address of RAM 6 storing the data Wj to the RAM 6 three slots later, i.e., at the slot T95. As a result, the data <Wj> is written into RAM 6.

The foregoing is a detailed description of the data error detection and correction circuit 1.

Error flag detection circuit 10, flag detection circuit 11 and so on shown in FIG. 2 will now be described.

(i) Error flag detection circuit 10

The foregoing description is based on the assumption that the format of the data stored in the disc is that shown in FIG. 1 and that the four correction data P0 to P3 are provided. Actually, however, one frame Fr includes four correction data Q0 to Q3 instead of four data among the data W0 to W27, and the data are stored at random in the disc in a manner known as cross-interleaving. This is described in detail in Japanese Patent Preliminary Publication No. Sho 57-4629. The data error detection and correction circuit 1 detects and corrects data errors based on the correction data P0 to P3 as described above, this being referred to as C1 decoding. At this time, the circuit 1 outputs flags E0 to E2 to the error flag detection circuit 10. The error flag detection circuit 10 forms C1 flag in accordance with the flags E0 to E2 fed thereto during C1 decoding, and outputs the C1 flags to RAM 6 for writing. The C1 flag is a flag indicating whether the data checked by the C1 decoding still contain those data which have not yet been corrected. Next, the data error detection and correction circuit 1 again detects and corrects data errors based on the correction data Q0 to Q3 in a manner described above for the C1 decoding, this being referred to as C2 decoding, and at this time the circuit 1 outputs flags E0 to E2 to the error flag detection circuit 10. Also, at this time, the C1 flag is fed to the error flag detection circuit 10. The error flag detection circuit 10 forms C2 flag in accordance with the flags E0 to E2 fed thereto at the time of C2 decoding and the C1 flag, and outputs the C2 flag to RAM 6 for writing. The C2 flag is a flag indicating whether the twenty-four (24) data have not been corrected, that is to say, whether the data have a probability of error higher than a reference level, and this flag is rendered "1" when the data has not yet been corrected and therefore has a high probability of error.

Thus, the error flag detection circuit 10 serves to form C1 flag and C2 flag and write them into RAM 6.

During the C1 decoding, the correction data Q0 to Q3 used for the C2 decoding serve as the signal data. More specifically, during C2 decoding, a total number of the data at the time of the syndrome calculation is 28, i.e., 24 musical signal data and 4 error correction data Q0 to Q3.

(ii) Flag detection circuit 11. etc.

When the C1 decoding and the C2 decoding are completed, the musical signal data are sequentially read from RAM 6 together with their respective C2 flags under the control of the address control circuit 8 and fed to parallel-to-serial data converter 12 via the data bus DABS2. At this time, the flag detection circuit 11 checks the C2 flag associated with each data to determine whether the data has been corrected, and if it is determined that the data has not been corrected, the flag detection circuit 11 outputs control signal TEI to a correction circuit 13. In accordance with the control signal TEI, the correction circuit 13 determines whether the data outputted from the parallel-to-serial data converter 12 have been corrected. If the data has been corrected, this data is fed from the correction circuit 13. On the other hand, if the data has not been corrected, the correction circuit 13 corrects the data by Linear Interpolation or Previous Data Hold technique and outputs the corrected data to the parallel-to-serial data converter 14. The serial-to-parallel data converter 14 functions to convert the serial data, outputted from the correction circuit 13, to parallel data and feed them to a digital-to-analog converter (not shown). The output of the digital-to-analog converter is fed to a loudspeaker for producing a musical sound.

What is claimed is:

1. A data error detection and correction circuit for detecting and correcting data errors in a group of data using Reed-Solomon codes comprising:
   (a) memory means for storing said group of data;
   (b) a syndrome calculation circuit for receiving the group of data and for producing syndromes Si (i is a positive integer) from said group of data;
   (c) an internal data bus coupled to the syndrome calculation circuit;
   (d) first data conversion means coupled to the internal data bus for converting data on said internal data bus into logarithmic data;
   (e) multiplier-divider means, coupled to the first data conversion means, for operating on the data on said internal data bus by addition and subtraction operations of said logarithmic data;
   (f) second data conversion means, coupled to the multiplier-divider means, for antilogarithmically converting data from said multiplier-divider means;
   (g) addition and subtraction means, coupled to the second data conversion means and the internal data bus, for operating on the data from said second data conversion means and supplying resulting data to said internal data bus;
   (h) a first error detection circuit, coupled to the internal data bus, for detecting whether a single error exists in said group of data in accordance with said syndromes and said resulting data on said internal data bus to generate a first error detection signal by means of determinations whether $S1 \cdot S1 = S0 \cdot S2$, $S2 \cdot S2 = S1 \cdot S3$, $S1 \neq 0$, $S2 \neq 0$, $S3 \neq 0$ and $S4 \neq 0$;
   (i) a first error location detection circuit, coupled to the internal data bus, for detecting a location where the single error exists at the time said first error detection circuit detects the single error and producing a first error location signal;
   (j) address control means for addressing said memory means in accordance with said first error detection signal and said error location signal to read an error data therefrom; and
   (k) a data correction circuit, coupled to the internal data bus and coupled to receive data from the memory means, for adding one of said syndromes on said internal data bus to said error data outputted from said memory means to thereby produce corrected data to replace said error data.

2. A data error detection and correction circuit according to claim 1, wherein
   said multiplier-divider means comprises a first delay circuit for delaying an output from said first data conversion means, and an addition circuit for adding an output from said first delay circuit to the output from said first data conversion means; and
   said addition and subtraction means comprises a second delay circuit for delaying an output from said second data conversion means, and an addition circuit for adding an output from said second delay circuit to the output from said second data conversion means;
   said multiplier-divider means outputting data log $(S1 \cdot S1)$ and log $(S0 \cdot S2)$ sequentially in this order based on the syndromes S1, S1, S0 and S2 sequentially supplied in this order to said first data conversion means;
   said addition and subtraction means outputting data $S1 \cdot S1 + S0 \cdot S2$ based on sequential outputs $S1 \cdot S1$ and $S0 \cdot S2$ of said second data conversion means to which outputs log $(S1 \cdot S1)$ and log $(S0 \cdot S2)$ are sequentially applied from said multiplier-divider means;
   said multiplier-divider means further outputting data log $(S2 \cdot S2)$ and log $(S1 \cdot S3)$ sequentially in this order based on the syndromes S2, S2, S1, and S3 sequentially supplied in this order to said first data conversion means; and
   said addition and subtraction means further outputting data $S2 \cdot S2 + S1 \cdot S3$ based on sequential outputs $S2 \cdot S2$ and $S1 \cdot S3$ of said second data conversion means to which outputs log $(S2 \cdot S2)$ and log $(S1 \cdot S3)$ are sequentially applied from said multiplier-divider means; and wherein
   said first error detection circuit determines whether the syndromes S0, S1, S2, and S3 from said syndrome calculation circuit and the values $S1 \cdot S1 + S0 \cdot S2$ and $S2 \cdot S2 + S1 \cdot S3$ are zero and generating the first error detection signal when the syndromes S0, S1, S2, and S3 are not zero and the values S1·S1+S0·S2 and S2·S2+S1·S3 are zero.

3. A data error detection and correction circuit for detecting and correcting data errors in a group of data using Reed-Solomon codes comprising:
   (a) memory means for storing said group of data;
   (b) a syndrome calculation circuit for receiving the group of data and for producing syndromes Si (i is a positive integer) from said group of data;
   (c) an internal data bus coupled to the syndrome calculation circuit;
   (d) first data conversion means, coupled to the internal data bus, for converting data on said internal data bus into logarithmic data;
   (e) multiplier-divider means, coupled to the first data conversion means, for operating on the data on said internal data bus by addition and subtraction operations of said logarithmic data;
   (f) second data conversion means, coupled to the multiplier-divider means, for antilogarithmically converting data from said multiplier-divider means;
   (g) addition and subtraction means, coupled to the second data conversion means and the internal data bus, for operating on the data from said second data conversion means and supplying resulting data to said internal data bus;
   (h) a double error detection circuit, coupled to the internal data bus, for detecting whether double errors exist in said group of data in accordance with the output data of said multiplier-divider means and said second data conversion means by means of determinations whether $(S1·S2+S0·S3)/(S1·A1+A0·S2)=\alpha^k+\alpha^l$, $(S2·S2+S1·S3)/(S1·S1+S0·S2)=\alpha^k·\alpha^l$, wherein k and l are zero or positive integers, said double error detection circuit generating a double error detection signal and a double error location signal when double errors are detected;
   (i) address control means for addressing said memory means in accordance with said double error detection signal and said double error location signal to read error data therefrom; and
   (j) a data correction circuit, coupled to the internal data bus and coupled to receive data read from the memory means, for adding data fed from said internal data bus representing data errors to said error data read from said memory means, respectively, to thereby produce corrected data to replace said error data.

4. A data error detection and correction circuit according to claim 3, wherein
   said multiplier-divider means comprises a first delay circuit for delaying an output from said first data conversion means, and an addition circuit for adding an output from said first delay circuit to the output from said first data conversion means; and
   said addition and subtraction means comprises a second delay circuit for delaying an output from said second data conversion means, and an addition circuit for adding an output from said second delay circuit to the output from said second data conversion means;
   said multiplier-divider means outputting data log (S1·S1) and log (S0·S2) sequentially in this order based on the syndromes S1, S1, S0, and S2 sequentially supplied in this order to said first data conversion means;
   said addition and subtraction means outputting data S1·S1+S0·S2 based on sequential outputs S1·S1 and S0·S2 of said second data conversion means to which outputs log (S1·S1) and log (S0·S2) are sequentially applied from said multiplier-divider means;
   said multiplier-divider means further outputting data log (S2·S2) and log (S1·S3) sequentially in this order based on the syndromes S2, S2, S1, and S3 sequentially supplied in this order to said first data conversion means;
   said addition and subtraction means further outputting data S2·S2+S1·S3 based on sequential outputs S2·S2 and S1·S3 of said second data conversion means to which outputs log (S2·S2) and log (S1·S3) are sequentially applied from said multiplier-divider means;
   said multiplier-divider means further outputting data log (S1·S2) and log (S0·S3) sequentially in this order based on the syndromes S1, S2, S0 and S3 sequentially supplied in this order to said first data conversion means;
   said addition and subtraction means further outputting data S1·S2+S0·S3 based on sequential outputs S1·S2 and S0·S3 of said second data conversion means to which outputs log (S1·S2) and log (S0·S3) are sequentially applied from said multiplier-divider means; and
   said multiplier-divider means further outputting data 1 log (S1·S2+S0·S3)/(S1·S1+S0·S2) and log (S2·S2+S1·S3)/(S1·S1+S0·S2) based on the output data S1·S1+S0·S2, S2·S2+S1·S3, and S1·S2+S0·S3 from said addition and subtraction means; and wherein
   said double error detection circuit comprises a circuit for obtaining a set of zero or integers k and l in which $k+l=B$ and $B=\log(S2·S2+S1·S2)/(S1·S1+S0·S2)$, a data conversion circuit for antilogarithmically converting the data k and l into data $\alpha^k$ and $\alpha^l$, respectively, an addition circuit for obtaining a value $CA=\alpha^4+\alpha^k+\alpha^l$ in which $\alpha^4=(S1·S2+S0·S3)/(S1·S1+S0·S2)$ which is outputted from said second data conversion means, and a zero detection circuit for determining whether the value CA is zero and generating the double error detection signal and the double error location signal when the value CA is zero.

5. A data error detection and correction circuit according to claim 4, wherein
   said circuit for obtaining a set of k and l of said second error detection circuit comprises first means for obtaining a value $l=B/2+1$ based on the value B from said multiplier-divider means, and second means for obtaining a value $k=B-l$ based on the value B from said multiplier-divider means and the value l from said first means; and
   said double error detection circuit further comprises means for making increment of the number l and reactuating said double error detection circuit.

* * * * *